(12) United States Patent
Bijl et al.

(10) Patent No.: US 11,262,037 B2
(45) Date of Patent: Mar. 1, 2022

(54) STREET LIGHTING POLE (71) Applicant: SIGNIFY HOLDING B.V., Eindhoven (NL)

(72) Inventors: Petra Bijl, Eindhoven (NL); Koos Van Oorschot, Eindhoven (NL); Ay Ling De Goederen-Oei, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/252,142

(22) PCT Filed: Jun. 17, 2019

(86) PCT No.: PCT/EP2019/065823
§ 371 (c)(1),
(2) Date: Dec. 14, 2020

(87) PCT Pub. No.: WO2020/002016
PCT Pub. Date: Jan. 2, 2020

(65) Prior Publication Data
US 2021/0116088 A1 Apr. 22, 2021

(30) Foreign Application Priority Data
Jun. 28, 2018 (EP) .................................... 18180429

(51) Int. Cl.
F21S 8/08 (2006.01)
E04H 12/00 (2006.01)
(Continued)

(52) U.S. Cl.
CPC .............. *F21S 8/088* (2013.01); *E04H 12/00* (2013.01); *F21V 21/10* (2013.01);
(Continued)

(58) Field of Classification Search
CPC .... F21S 8/08; F21S 8/081; F21S 8/083; F21S 8/086; F21S 8/085; F21S 8/088;
(Continued)

(56) References Cited

U.S. PATENT DOCUMENTS 1,882,228 A 10/1932 Ne Page
6,164,369 A * 12/2000 Stoller ............... H05K 7/20572
165/104.33

(Continued)

FOREIGN PATENT DOCUMENTS

CN 108024478 A 5/2018
DE 202010007010 U1 11/2011
(Continued)

Primary Examiner — Jong-Suk (James) Lee
Assistant Examiner — James M Endo (57) ABSTRACT A street lighting pole including at least one upright outer wall portion defining an enclosed space of the street lighting pole; a substantially vertically arranged divider (11) dividing at least part of the enclosed space into at least two substantially vertically arranged bays, the at least two bays including a first bay and a second bay; a space air inlet into the enclosed space arranged at a bottom of the upright outer wall portion; a space air outlet from the enclosed space arranged at a top of the upright outer wall portion; a respective individual air inlet for each of the at least two bays arranged at the bottom of the divider; and a respective individual air outlet for each of the at least two bays arranged at the top of the divider. The respective at least two individual air inlets and the respective at least two individual air outlets provide separate air flows in each of the at least two bays for cooling thereof, allowing to individually control the climate in each of the at least two bays of the street lighting pole.

16 Claims, 4 Drawing Sheets (51) Int. Cl.
*F21V 21/10* (2006.01)
*H05K 7/20* (2006.01)
*F21W 131/103* (2006.01)
*F21V 29/67* (2015.01)
*F21V 29/508* (2015.01)

(52) U.S. Cl.
CPC ........ *H05K 7/20136* (2013.01); *F21V 29/508* (2015.01); *F21V 29/67* (2015.01); *F21W 2131/103* (2013.01)

(58) Field of Classification Search
CPC . F21V 29/508; F21V 21/116; H05K 7/20136; H05K 7/20145; H05K 7/20127; F21W 2131/103; Y02B 20/72; H02G 3/03; H02G 3/0493
USPC ................ 361/692, 693, 695, 698; 174/45 R
See application file for complete search history.

(56) References Cited

U.S. PATENT DOCUMENTS

| | | | | |
|---|---|---|---|---|
| 6,912,408 | B1* | 6/2005 | O'Neill | H01Q 1/12 343/890 |
| 7,345,873 | B2* | 3/2008 | Dey | G06F 1/20 361/691 |
| 7,830,658 | B2* | 11/2010 | Van Andel | F28F 1/122 361/679.53 |
| 8,593,370 | B2* | 11/2013 | Caldwell | H01Q 1/1242 343/890 |
| 9,515,460 | B1 | 12/2016 | Moghal | F21V 21/10 |
| 2003/0233806 | A1* | 12/2003 | Kuebler | E04H 12/003 52/838 |
| 2005/0285011 | A1* | 12/2005 | Harwood | E04H 12/2261 248/519 |
| 2006/0120043 | A1* | 6/2006 | Wolford | H05K 1/0272 361/695 |
| 2008/0285265 | A1* | 11/2008 | Boissevain | F21S 8/088 362/218 |
| 2009/0168346 | A1* | 7/2009 | Miyoshi | H05K 7/20145 361/695 |
| 2009/0262525 | A1* | 10/2009 | Lai | F21S 9/026 362/192 |
| 2009/0273261 | A1* | 11/2009 | Fournier | H02G 3/081 312/237 |
| 2010/0165615 | A1* | 7/2010 | Aarts | F04F 7/00 362/227 |
| 2010/0220467 | A1* | 9/2010 | Daidone | F21S 9/026 362/183 |
| 2010/0252321 | A1* | 10/2010 | Fournier | E04H 12/2253 174/45 R |
| 2011/0156984 | A1* | 6/2011 | Caldwell | H01Q 1/1207 343/890 |
| 2011/0198064 | A1* | 8/2011 | Smalen | H05K 7/20909 165/121 |
| 2011/0255273 | A1* | 10/2011 | Lai | F21S 8/083 362/183 |
| 2014/0085820 | A1* | 3/2014 | Yamamoto | H05K 7/20909 361/695 |
| 2014/0182811 | A1* | 7/2014 | Hager | H01Q 1/02 165/47 |
| 2014/0225533 | A1* | 8/2014 | Park | H02J 7/0014 315/307 |
| 2015/0156919 | A1* | 6/2015 | Schroedl | H05K 7/20918 361/692 |
| 2016/0150675 | A1* | 5/2016 | Wilcox | H05K 7/14 361/692 |
| 2017/0122546 | A1* | 5/2017 | Abbott | F21V 33/00 |
| 2017/0307192 | A1* | 10/2017 | LaFemina | E04H 12/24 |

FOREIGN PATENT DOCUMENTS

FR 3032779 A1 8/2016
GA 2778677 A1 11/2013

* cited by examiner

STREET LIGHTING POLE

CROSS-REFERENCE TO PRIOR APPLICATIONS

This application is the U.S. National Phase application under 35 U.S.C. § 371 of International Application No. PCT/EP2019/065823, filed on Jun. 17, 2019, which claims the benefit of European Patent Application No. 18180429.5, filed on Jun. 28, 2018. These applications are hereby incorporated by reference herein.

FIELD OF THE INVENTION

The present invention relates to a street lighting pole arranged to hold telecommunication equipment.

BACKGROUND OF THE INVENTION

Recently street lighting poles have been modified to include telecommunication equipment (radios, antennas, cables), such that the street lighting pole also gets a wireless telecommunications functionality. The equipment is integrated within the outer surface of the light pole with the purpose of obscuring it from public view. This may be referred to as telecom smart pole, or smart pole.

With cellular data traffic expected to grow, mobile network operators are struggling to acquire new cell sites in public areas to provide the best possible mobile broadband coverage and capacity for their customers. By renting space in the smart poles, they are able to densify their networks so that citizens can enjoy both safely lit streets and better smartphone data capacity.

However, since the need for mobile data transmission is growing very rapidly and the capacity of a single telecommunication radio and antenna is limited, there is the need to (a) use radios with a higher radio throughput and (b) adding more radios that communicate over different parts of the radio spectrum. As a result, there is a need to also include more radios in the smart pole.

Including more radios in the smart pole will, however, result in an increased thermal load in the pole. This might give rise to problems due to overheating of equipment. A particularly disturbing problem that may arise in currently available smart poles is that when one equipment fails because of overheating, the overheating results in malfunctioning of another equipment arranged in the pole. Should the affected equipment further be that of a different operator, liability problems are likely to occur.

SUMMARY OF THE INVENTION

It is an object of the present invention to overcome the aforementioned problems, and to provide an improved street lighting pole.

According to a first aspect of the invention, this and other objects are achieved by a street lighting pole comprising at least one upright outer wall portion defining an enclosed space of the street lighting pole; a substantially vertically arranged divider having a length and extending with its length along a length axis in between a space air inlet and a space air outlet and dividing at least part of the enclosed space into at least two substantially vertically arranged bays, the at least two bays including a first bay and a second bay. The street lighting pole further comprises the space air inlet into the enclosed space arranged at a bottom of the upright outer wall portion; the space air outlet from the enclosed space arranged at a top of the upright outer wall portion; a respective individual air inlet for each of the at least two bays arranged proximate to said space air inlet at the bottom of the divider; and a respective individual air outlet for each of the at least two bays arranged proximate to said space air outlet at the top of the divider. The respective at least two individual air inlets and the respective at least two individual air outlets provide separate air flows in each of the at least two bays for cooling thereof.

Proximate in this context means that the distance between the space air inlet and the individual air inlet is equal to or less than the diameter of the bottom portion of the pole, for example the space air inlet and the individual air inlet can mutually be spaced at a distance of half the diameter (or radius) or be adjacent to each other. The above similarly applies to the mutual distance of the space air outlet and the individual air outlet.

The space air inlet and space air outlet allow for air to flow in and through the enclosed space. Such an airflow provides cooling of the enclosed space and thus of any telecommunication equipment which may be mounted therein. When more than one radio is mounted in the enclosed space, providing a single general cooling of the enclosed space might be inefficient, since for example overheating of an equipment could negatively affect other equipment positioned therein. The present invention is based on the understanding that by providing the aforementioned divider, dividing at least a part of the enclosed space into at least two bays, together with respective at least two individual air inlets and outlets, separate airflows into and through each bay are allowed. By the mutual proximate positioning of the space air inlet and the individual air inlet(s) the risk of exchange of air between the two bays is counteracted. This applies similarly to the space air outlet and individual air outlet. Said exchange of air is undesired because each bay may accommodate respective, specific electronic equipment of which the resistance to thermal load could be mutually significantly different. Heat generated by a first electronic device that would be transported via air exchange to a second electronic device of less thermal resistance, could be detrimental to said second electronic device. By the differentiating features this risk is counteracted. The divider acts as a barrier for airflow between the at least two bays defined by the divider and the upright outer wall portion of the street lighting pole. The airflow allowed by the individual air inlet and the individual air outlet of the first bay will thereby cool any equipment positioned in the first bay, and generally not that of the second bay, whereas the airflow allowed by the individual air inlet and the individual air outlet of the second bay will cool any equipment positioned in the second bay, and generally not that of the first bay. Independent airflows, and thus climates, are thereby allowed in each of the at least two bays. As a result, any problem, such as overheating of equipment or other, occurring in one bay will not affect the climate of the other bay. A multifunctional light pole including telecommunication equipment, which can reduce the need for mounting poles exclusively used for holding telecommunication equipment is thus provided. Such a street lighting pole simultaneously contributes to an improved data network and safely lit streets.

In accordance with an embodiment of the street lighting pole, the at least two bays are substantially airtight with respect to each other. Thereto typically the divider has a sealing length, over this sealing length or at least over 70% thereof, for example 90%, i.e. in between the respective individual air inlet and the respective individual air outlet, the divider divides said at least two bays in a substantially airtight manner with respect to each other. This means that air flowing in the first bay will substantially not flow into the second bay, whereas air flowing in the second bay will substantially not flow into the first bay. Generally, an airflow of a bay may be considered separate and provide efficient individual cooling when no more than 20% of the airflow of one bay can enter another bay. Preferably, no more than 10% of the airflow of e.g. the first bay can enter the second bay, and vice versa.

In accordance with an embodiment of the street lighting pole, the divider is a substantially airtight H-shaped base structure. The H-shaped base structure can be formed by stems connected by a crossbar, and is dimensioned such that ends of the stems bear against the upright outer wall portion in a sealing connection, thereby sealing the enclosed space and the bays in the vertical direction of the street lighting pole. The H-shape offers a relatively good profile for fulfilling the strength requirement, the possibility of accommodating equipment, and ease of access to equipment. However, other shapes of the divider, such as T-shape, Y-shape and U-shape could be part of the invention. Such a structure being airtight will require no additional sealing elements for providing a substantially airtight division between the at least two bays.

In accordance with an embodiment of the street lighting pole, the divider is a substantially airtight vertical inner wall. The airtight vertical wall will allow maximal use of the space within the enclosed space, as it will divide the enclosed space in two. The end portions of such an inner wall are arranged sealingly against the inside of the upright outer wall portion in order to provide airtightness to the bays.

In accordance with an embodiment of the street lighting pole, the divider is a substantially airtight insert mountable at a vertical base structure or inner wall of the street lighting pole. This allows adopting street lighting poles comprising a non-airtight vertical base structure or inner wall, or other support structure, such to provide a substantially airtight divider. An additional advantage with providing an airtight insert is that it allows material from a vertical base structure or inner wall to be left out where not needed for the structural integrity, e.g. for weight reduction of the street lighting pole, without compromising the airtightness of the divider. Such an airtight insert could comprise an airtight sheet or film of a plastic, ceramic or metallic material. Providing an insert of a material having low thermal conductivity would further increase the independent climate control of the at least two bays, as heat from one bay would not be conducted, or would be conducted at a slow rate, through the insert to the bay at the other side of the divider.

In accordance with an embodiment of the street lighting pole, the street lighting pole further comprises at least one forced cooling source arranged to cool at least one of the at least two bays. This allows increasing the cooling capacity of the first and/or the second bay, and possible other bays arranged in the street lighting pole, and thus of any telecommunication equipment mounted therein. By using a source of forced cooling for any or each of the at least two bays, cooling of any telecommunication equipment arranged therein can be increased by convection and/or conduction.

In accordance with an embodiment of the street lighting pole, the at least one forced cooling source is a fan. Such a fan forces the air to flow into either of the at least two bays at a higher rate and with increased turbulence, thereby increasing the cooling of any telecommunication equipment arranged therein by convection at least.

In accordance with an embodiment of the street lighting pole, the at least one forced cooling source comprises a liquid cooling unit. A liquid cooling unit can be embodied as a cooling element containing a cooling liquid, such as cold water, arranged to extend through a bay for transport of the heat out of the bay, and thereby cooling any telecommunication equipment mounted therein, to an area where it can be cooled with outside air, e.g. by means of cooling fins.

In accordance with an embodiment of the street lighting pole, the at least one cooling source is arranged at either of the individual air inlet and the individual air outlet, or, when having two forced cooling sources, at both the individual air inlet and the individual air outlet for either of the at least two bays. The arrangement of any forced cooling source can thus be adapted to the requirements of a particular street lighting pole and to the arrangement of any telecommunication equipment mounted therein. Arranging a forced cooling source at the individual air inlet or the individual air outlet for any of the at least two bays provides an increased airflow through the bay, and thereby an increased cooling of the bay. Providing forced cooling sources both at the individual air inlet and the individual air outlet can be advantageous when a significant cooling of the bay is needed.

In accordance with an embodiment of the street lighting pole, the at least two bays are provided with respective individual forced cooling sources for cooling each of the at least two bays individually. Thereby, the cooling of each of the at least two bays can be adapted to the requirements on cooling thereof, typically depending on the nature and number of telecommunication equipment mounted therein.

In accordance with an embodiment of the street lighting pole, each of the space air inlet and the space air outlet is arranged along the circumference of the upright outer wall portion. Each of the space air inlet and the space air outlet may be embodied as openings extending along a portion of the circumference of the upright outer wall, or along the entire circumference of the upright outer wall. Providing a ring-shaped space air inlet and space air outlet, thus extending along the entire circumference of the upright outer wall, allows for a good distribution of the air flowing in and out through the space air inlet and the space air outlet, respectively, avoiding the generation of hot zones within the enclosed space.

In accordance with an embodiment of the street lighting pole, each of the space air inlet and the space air outlet is constituted by a respective meshed circumferential portion of the upright outer wall portion. The meshed circumferential portion prevents insects or other animals from entering the enclosed space. It also provides an obstruction for vandalism, preventing objects from being deposited in the enclosed space. This is advantageous as the presence of insects or objects could negatively affect the air flow through the enclosed space and thus, the function of any equipment positioned therein.

In accordance with an embodiment of the street lighting pole, each of the at least two bays are accessible individually of each other. The individually accessible bays provide the possibility of an operator to perform maintenance or repair work in e.g. the first bay without affecting the functioning of the second bay. The individual access points are preferably being mutually oppositely arranged at the upright outer wall portion and on either side of the divider, facilitating access to the at least two bays and any equipment positioned therein from opposite sides. The individual access points can be embodied as door elements provided at the upright outer wall portion and are, in closed position, preferably flush with the upright outer wall portion such to counteract vandalism and to provide a sealed and airtight enclosed space. The door elements can alternatively be embodied as the complete upright outer wall portion.

In accordance with an embodiment of the street lighting pole, the enclosed space is contained in a base of the street lighting pole. The base of the street lighting pole is generally larger than a top or mid-portion of the street lighting pole, whereby more space is available for positioning of any telecommunication equipment. Such equipment can further be accessible more easily when provided in the base of the street lighting pole, as an operator accessing the equipment does not need to climb the street lighting pole but can perform any maintenance or reparation work from the ground.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention in which.

As illustrated in the figures, the sizes of layers and regions are exaggerated for illustrative purposes and, thus, are provided to illustrate the general structures of embodiments of the present invention. Like reference numerals refer to like elements throughout.

DESCRIPTION OF EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. The present invention will typically be described with reference to its usual orientation as shown in the drawings.

Figure 1A:
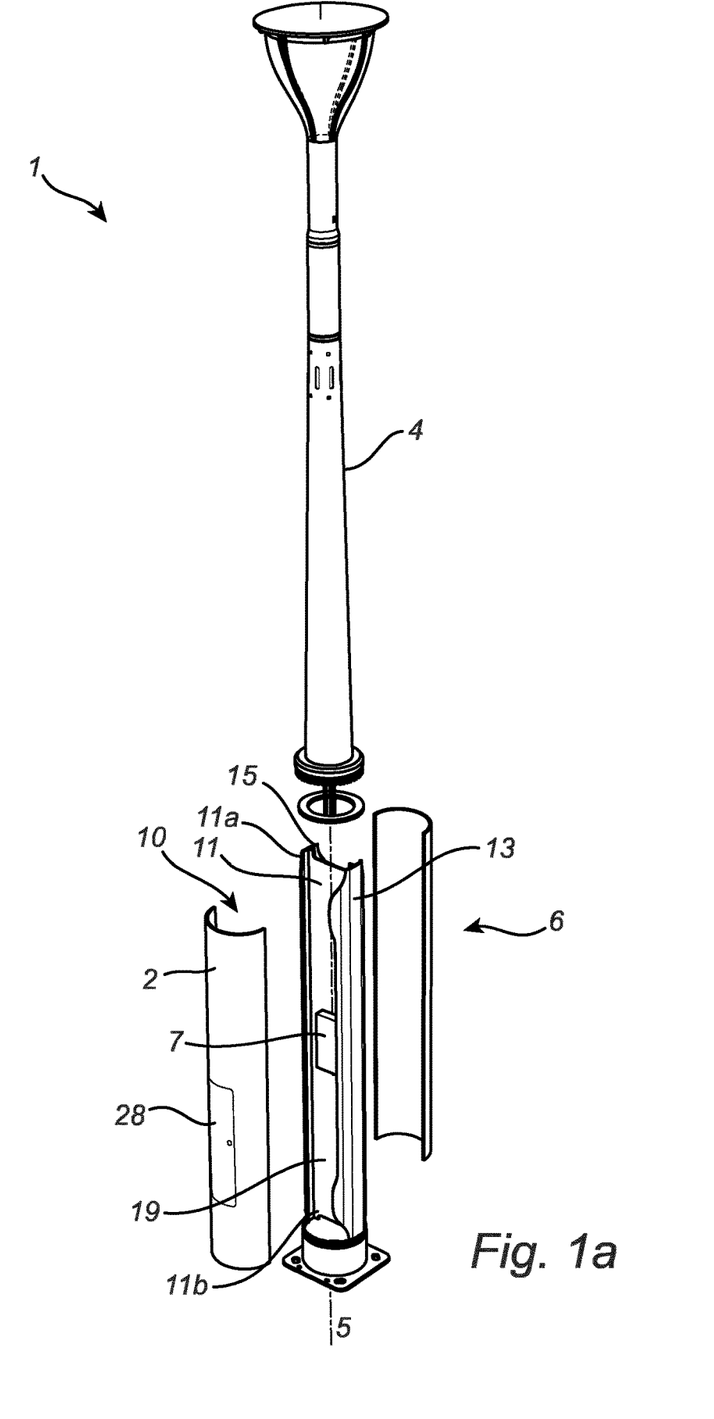
FIG. 1a is a perspective view of a street lighting pole according to an embodiment of the present invention.
Figures 1B, 2:
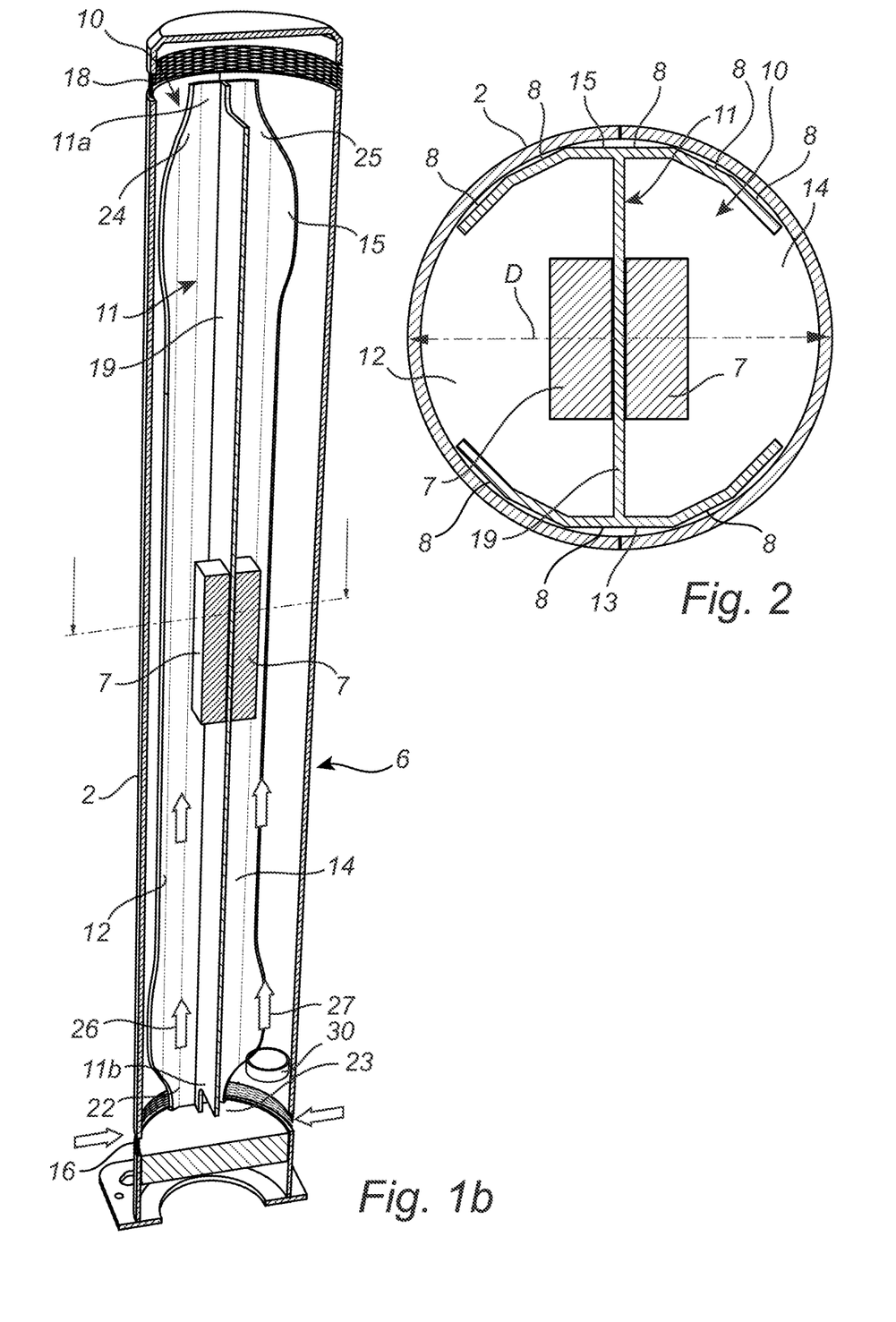
FIG. 1b is a schematic cut-open perspective view of an enclosed space of the street lighting pole according to an embodiment of the present invention.
FIG. 2 is a schematic cross-sectional top view of an enclosed space of the street lighting pole according to an embodiment of the present invention of FIG. 1b.

With reference to FIGS. 1a-b, there is provided an elongated street lighting pole 1 having a tubular body 4 with a hollow core, and an upright outer wall portion 2 extending along a length axis 5 in the axial direction of the street lighting pole 1, in this case in the vertical direction of gravity. The tubular body 4 and the upright outer wall portion 2 are here each embodied as a round cylindrical or tubular wall, but could be of any cylindrical shape, such as a polygonal cylinder. The upright outer wall portion 2 defines an enclosed space 10 at a bottom portion 6 of the street lighting pole 1, also called the pole base. The enclosed space 10 may however be defined by an upright outer wall portion of another portion of the street lighting pole, such as a mid-portion or other.

The street lighting pole 1 further comprises a substantially vertically arranged divider 11, extending axially of the street lighting pole 1. The divider 11 is here arranged centrally within the enclosed space 10, for dividing the enclosed space 10 into substantially vertically arranged first and second bays 12, 14. It is also conceivable to arrange the divider 11 at a non-central position within the enclosed space 10, as is providing several dividers 11 for dividing the enclosed space 10 into more than two bays. The divider 11 can for example be made of a steel, aluminum or plastic material. The divider 11 comprises lateral end portions 13, 15 which are arranged to bear against the inside of the upright outer wall portion 2, defining the enclosed space 10, in a substantially sealing connection. Seals of e.g. rubber, plastic or foam material can, if needed, be introduced between the lateral end portions 13, 15 of the divider 11 and the upright outer wall portion 2, to ensure the sealing connection. The divider 11 shown in this embodiment is an H-shaped base structure, which constitutes a structural element of the street lighting pole 1. The lateral end portions 13, 15 of the H-shaped base structure are thus in a sealing connection with the inside of the upright outer wall portion 2, see FIG. 2. In the H-shaped base structure 11, the lateral end portions 13, 15 are constituted by stems, and a crossbeam 19 extending between the stems 13, 15 is further provided completing the H-shape. The stems 13, 15 are here radially bent such to follow a portion of the tubular shape of the upright outer wall portion 2. This allows limiting the size, in particular the diameter D, of the street lighting pole while providing the necessary mechanical stability thereto, see FIG. 2. The stems 13, 15 are arranged tightly against the upright outer wall 2 and any space there between is sealed by arranging a seal 8 of e.g. a rubber, plastic or foam material therein. Any other way of achieving a sealing connection between the lateral ends 13, 15 of the divider 11 and the upright outer wall portion 2 defining the enclosed space 10 is also conceivable, such as for example welding or, if efficient, direct manufacturing of the upright outer wall portion 2 and the divider 11 in one piece. The stems 13, 15 and the crossbeam 19 are here substantially airtight such to block air from passing from the first bay 12 to the second bay 14, and vice versa. The divider has a top 11a and a bottom 11b. The axial extension of the crossbeam 19 of the H-shaped base structure is not as large as that of the stems 13, 15, creating an axial recess at the top 11a and at the bottom 11b of the divider 11.

The first and second bays 12, 14 are arranged to extend axially of the street lighting pole 1 and comprises at least one mounting structure, not shown, for holding a telecommunication equipment 7 therein. Such mounting structures could be hole patterns and/or brackets, for example. Although the first and second bays 12, 14 in this exemplifying embodiment each comprises one mounting structure for holding a telecommunication equipment 7, it is possible to arrange more than one mounting structures in each bay such that either or both of the first and second bays 12, 14 can hold more than one telecommunication equipment 7. The first and second bays 12, 14 are accessible individually of each other by respective first and second door elements 28 provided at the upright outer wall portion 2. The first door element 28 in open position provides access to the first bay 12. The second door element (not shown) in open position provides access to the second bay 12. In closed position, the first and second door elements 28 are flush with the upright outer wall portion 2, providing a substantially airtight closure thereat. In FIG. 1a the door elements 28 are embodied as complete, round semi-cylinders, but could alternatively be any part of a cylindrical shape to match the shape of the upright outer wall portion 2. For example, a door element could encompass several faces of a polygonal, cylindrical shape, for example three faces of a hexagonally shaped cylinder or four faces of an irregular octagonally shaped cylinder.

The street lighting pole 1 further comprises a space air inlet 16 into the enclosed space 10, see FIG. 1*b*, for supplying air from the outside of the street lighting pole 1 to the first and second bays 12, 14. The space air inlet 16 is arranged at the bottom of the upright outer wall portion 2, at a circumferential portion thereof. The space air inlet may thus be ring-shaped. A space air outlet 18 from the enclosed space 10 is provided at the top of the upright outer wall portion 2. Together with the space air inlet 16, the space air outlet 18 allows for an air flow in the enclosed space 10. Here, the space air outlet 18 is arranged at a circumferential portion of the upright outer wall portion 2. Both the space air inlet 16 and the space air outlet 18 could, however, be embodied as non-circumferential portions of the upright outer wall portion 2. The position of the space air inlet and the space air outlet would in such an embodiment be arranged to allow air to flow in from the outside of the street lighting pole 1 towards the individual air inlets, and to flow out from the respective individual air outlets and further through the space air outlets to the outside of the street lighting pole 1. Alternatively, more than one space air inlet can be arranged at different portions of the upright outer wall portion 2, at the bottom thereof and preferably at different sides of the divider 11. Similarly, more than one space air outlet can be arranged at different portions of the upright outer wall portion 2, near the top thereof and preferably at different sides of the divider 11. Both the space air inlet 16 and the space air outlet 18 can be provided as respective meshed portions (see FIG. 4) of the upright outer wall portion 2. This prevents external bodies such as insects and other animals, from entering the enclosed space 10.

Figure 3:
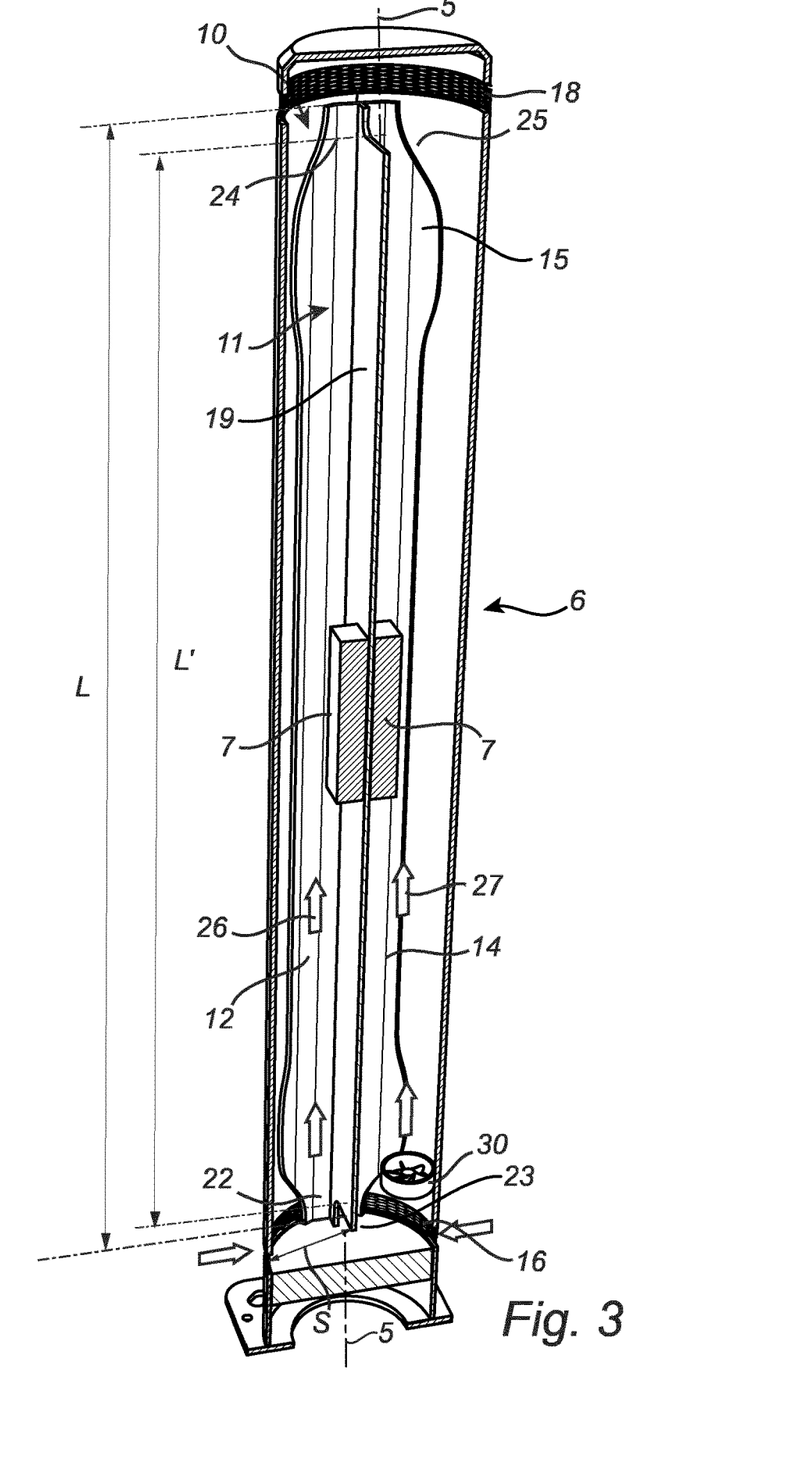
FIG. 3 is a schematic cut-open perspective view of an enclosed space of the street lighting pole according to an embodiment of the present invention.

Continuing with FIG. 1*b*, the enclosed space 10 and the divider 11 form respective first and second individual air inlets 22, 23 into the first and second bays 12, 14 at the bottom 11*b* and at different sides of the divider 11. The first and second individual air inlets 22, 23 are thus in fluid communication with the space air inlet 16, and allow air from the space air inlet 16 to be exclusively supplied to the first bay 12 and the second bay 14, respectively. As shown in FIG. 3 the space air inlet 16 is spaced apart from the individual air inlets 22, 23 at a distance S, which is roughly about the radius or half diameter of the bottom portion 6 of the street lighting pole. This distance S similarly applies to distance between the space air outlet 18 and individual air outlets 24, 25. When more than two bays are provided, an individual air inlet is provided for each one of the bays. Correspondingly, at the top 11*a* of the divider 11, the enclosed space 10 and the divider 11 form respective first and second individual air outlets 24, 25 from each of the first and second bays 12, 14. The first and second individual air outlets 24, 25 are in fluid communication with the space air outlet 18. As indicated regarding the individual air inlets, when more than two bays are provided in the enclosed space 10, an individual air outlet is provided from each one of the bays. The first individual air inlet 22 and individual air outlet 24 allow for an individual air flow in the first bay 12, whereas the second individual air inlet 23 and individual air outlet 25 allow for an individual air flow in the second bay 14. The air entering the first bay 12 through the first individual air inlet 22 and exiting via the first individual air outlet 24 can be referred to as a first airflow 26. The air entering the second bay 14 through the second individual air inlet 23 and exiting via the second individual air outlet 25 can be referred to as a second airflow 27. Due to the substantially airtight divider 11, and the sealing connection between the divider 11 and the upright outer wall 2 defining the enclosed space 10, the first airflow 26 and the second airflow 27 are separate from each other.

The size of the individual air inlets 22, 23 and outlets 24, 25 can be adapted to the nature and number of the telecommunication equipment mounted in each bay, here in the first and second bays 12, 14, such to provide an effective airflow there through and, consequently, an effective cooling of any telecommunication equipment mounted therein.

In operation, air comes from the outside of the street lighting pole 1 through the space air inlet 16 into the enclosed space 10. The divider 11 and the individual air inlets 22, 23 here split the air, forming the first and second air flows 26, 27. The first air flow 26 is thus allowed to flow upwards from the first individual air inlet 22 through the first bay 12, and out through the first individual air outlet 24, thereby cooling any equipment mounted in the first bay 12. The second air flow 27 is allowed to flow upwards from the second individual air inlet 23 through the second bay 14, and out through the second individual air outlet 25, thereby cooling any equipment mounted in the second bay 14. Air exiting the first and second bays 12, 14 through the respective individual air outlets 24, 25 can then exit the street lighting pole through the space air outlet 18.

To further control the separate airflows 26, 27 and with reference to FIG. 3, a forced cooling source 30 can be provided in order to achieve an increased cooling capacity of any telecommunication equipment arranged in the first and second bays 12, 14. In the embodiment of FIG. 3, the forced cooling source 30 is provided at the second individual air inlet 23. A forced cooling source 30 may also be provided at the first individual air inlet 22. Alternatively, the forced cooling source 30 can be arranged at the first and second individual air outlets 24, 25. As a third alternative, when a large cooling capacity is required, forced cooling sources 30 can be arranged at both the individual air inlets 22, 23 and outlets 24, 25 of either or both of the first and second bays 12, 14. A forced cooling source could also be provided inside any one of the first and second bays 12, 14, e.g. embodied as an integrably mounted forced cooling source at a telecommunication equipment arranged therein. Here, the forced cooling source 30 is a fan arranged at the second individual air inlet 23 such to force air from the space air inlet 16 to flow into the second bay 14. Any other source of forced cooling, such as for example liquid cooling as illustrated in FIG. 1*b*, is however also conceivable within the concept of the present invention.

In operation, air comes from the outside of the street lighting pole 1 through the space air inlet 16. The divider 11 has a length L along the length axis 5 and extends in between the space air inlet 16 and the space air outlet 18 and the first and second individual air inlets 22, 23 here split the air, allowing to form the first and second air flows 26, 27. The divider has a sealing length L' and in between the respective individual air inlet and the respective individual air outlet said divider divides or separates over its sealing length said at least two bays (12, 14) in a substantially airtight manner with respect to each other. This means that in the range in sealing length L' there is essentially no exchange of air between the first and second bay. In FIG. 3 the sealing length L' extends from individual air inlets 22, 23 to individual air outlets 24, 25, yet alternatively said sealing length L' may extend over only at least 70%, for example at least 90%, of the indicated sealing length L'. The first air flow 26 flows upwards from the first individual air inlet 22 through the first bay 12, and out through the first individual air outlet 24, thereby cooling any equipment mounted in the first bay 12. At the second individual air inlet 23, the fan 30 forces air to flow into the second bay 14, whereby the second air flow 27 flows upwards through the second bay 14 at a higher rate than that of the first air flow 26, and out through the second individual air outlet 25, thereby providing significant cooling of any equipment mounted in the second bay 14. Air exiting the first and second bays 12, 14 through the respective individual air outlets 24, 25 can then exit the street lighting pole through the space air outlet 18.

Figure 4:
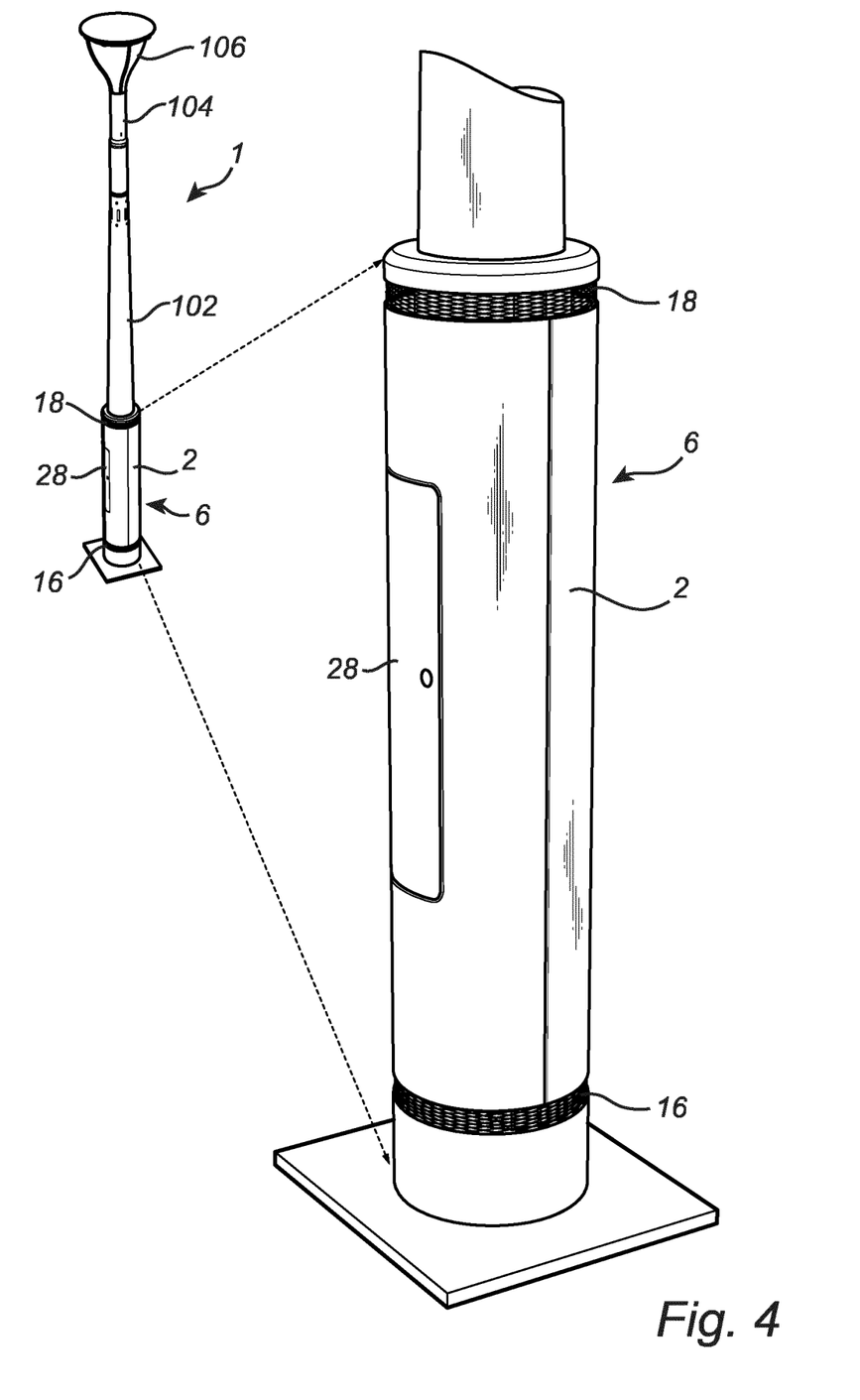
FIG. 4 is a perspective view of the street lighting pole according to an embodiment of the present invention.

FIG. 4 is a side view of a street lighting pole 1 according to an aspect of the present invention. The street lighting pole 1 can be considered as a modular structure comprising a pole base 6, a mid-pole 102, an antenna 104, and a luminaire 106 adapted to emit light.

The person skilled in the art realizes that the present invention by no means is limited to the preferred embodiments described above. On the contrary, many modifications and variations are possible within the scope of the appended claims. For example, the street lighting pole 1 could comprise at least one movable part adapted to regulate at least one of the first and second air flows 26, 27.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A street lighting pole comprising:
   a body having a mid-pole portion and a base portion;
   at least one upright outer wall portion defining an enclosed space of the street lighting pole at the base portion;
   the at least one upright outer wall portion extending in an axial direction of the street lighting pole;
   a substantially vertically arranged divider having a length and extending with its length along a length axis in between a space air inlet and a space air outlet and dividing at least part of said enclosed space into at least two substantially vertically arranged bays, said at least two bays including a first bay and a second bay;
   the divider having a first lateral end portion and a second lateral end portion to contact an inner surface of the at least one upright outer wall portion to form the at least two bays;
   the space air inlet into said enclosed space is arranged at a bottom of said upright outer wall portion;
   the space air outlet from said enclosed space is arranged at a top of said upright outer wall portion;
   a respective individual air inlet for each of said at least two bays arranged proximate to said space air inlet at said bottom of said divider; and
   a respective individual air outlet for each of said at least two bays arranged proximate to said space air outlet at said top of said divider,
   wherein said respective at least two individual air inlets and said respective at least two individual air outlets provide separate air flows in each of said at least two bays for cooling thereof.

2. The street lighting pole according to claim 1, wherein the divider over its sealing length in between the respective individual air inlet and the respective individual air outlet divides said at least two bays in a substantially airtight manner with respect to each other.

3. The street lighting pole according to claim 2, wherein said divider is a substantially airtight H-shaped base structure.

4. The street lighting pole according to claim 2, wherein said divider is a substantially airtight vertical inner wall.

5. The street lighting pole according to claim 2, wherein said divider is a substantially airtight insert mountable at a vertical base structure or inner wall of said street lighting pole.

6. The street lighting pole according to claim 1, further comprising at least one forced cooling source arranged to cool at least one of said at least two bays.

7. The street lighting pole according to claim 6, wherein said at least one forced cooling source is a fan.

8. The street lighting pole according to claim 6, wherein said at least one forced cooling source comprises a liquid cooling unit.

9. The street lighting pole according to claim 6, wherein said at least forced one cooling source is arranged at either of said individual air inlet and said individual air outlet, or, when having two forced cooling sources, at both said individual air inlet and said individual air outlet for either of said at least two bays.

10. The street lighting pole according to claim 6, wherein said at least two bays are provided with respective individual forced cooling sources for cooling each of said at least two bays individually.

11. The street lighting pole according to claim 1, wherein each of said space air inlet and said space air outlet is arranged along a circumference of said upright outer wall portion.

12. The street lighting pole according to claim 11, wherein each of said space air inlet and said space air outlet is constituted by a respective meshed circumferential portion of said upright outer wall portion.

13. The street lighting pole according to claim 1, wherein said enclosed space is contained in a base of said street lighting pole.

14. The street lighting pole according to claim 1, wherein each of said at least two bays are accessible individually of each other.

15. The street lighting pole according to claim 1, further comprising a crossbar extending between first lateral end portion and second lateral end portion to form an h-shape base structure.

16. A street lighting pole comprising:
    a body having a mid-pole portion and a base portion;
    at least one upright outer wall portion defining an enclosed space of the street lighting pole at the base portion;
    a substantially vertically arranged divider having a length and extending with its length along a length axis in between a space air inlet and a space air outlet and dividing at least part of said enclosed space into at least two substantially vertically arranged bays, said at least two bays including a first bay and a second bay;
    the space air inlet into said enclosed space is arranged at a bottom of said upright outer wall portion;
    the space air outlet from said enclosed space is arranged at a top of said upright outer wall portion;
    a respective individual air inlet for each of said at least two bays arranged proximate to said space air inlet at said bottom of said divider; and a respective individual air outlet for each of said at least two bays arranged proximate to said space air outlet at said top of said divider, wherein said respective at least two individual air inlets and said respective at least two individual air outlets provide separate air flows in each of said at least two bays for cooling thereof;

wherein the divider over its sealing length in between the respective individual air inlet and the respective individual air outlet divides said at least two bays in a substantially airtight manner with respect to each other; and wherein said divider is a substantially airtight H-shaped base structure.

* * * * *